United States Patent [19]

Shimizu et al.

[11] Patent Number: 4,920,074
[45] Date of Patent: Apr. 24, 1990

[54] SURFACE MOUNT PLASTIC PACKAGE SEMICONDUCTOR INTEGRATED CIRCUIT, MANUFACTURING METHOD THEREOF, AS WELL AS MOUNTING METHOD AND MOUNTED STRUCTURE THEREOF

[75] Inventors: Ichio Shimizu, Tamamura; Akio Hoshi, Isesaki; Sumio Okada, Takasaki; Soichiro Nakamura, Tokyo, all of Japan

[73] Assignee: Hitachi, Ltd., Tokyo, Japan

[21] Appl. No.: 160,177

[22] Filed: Feb. 25, 1988

[30] Foreign Application Priority Data

Feb. 25, 1987 [JP] Japan .................................. 62-40267
Aug. 20, 1987 [JP] Japan .................................. 62-207163

[51] Int. Cl.$^5$ ............................................ H01L 29/78
[52] U.S. Cl. .................................... 437/211; 437/220; 437/217; 437/219; 29/856; 361/421; 357/70; 357/72; 357/74
[58] Field of Search ............................. 357/70, 72, 74; 437/217, 219, 220, 211; 29/856; 361/421

[56] References Cited

FOREIGN PATENT DOCUMENTS

| 54-152867 | 1/1979 | Japan | 357/70 |
| 60-137048 | 7/1985 | Japan | 357/70 |
| 61-75553 | 4/1986 | Japan . | |

OTHER PUBLICATIONS

"Micro Devices No. 2" Nikkei McGraw-Hill, 6/11/84, pp. 148–154.

*Primary Examiner*—Andrew J. James
*Assistant Examiner*—David Soltz
*Attorney, Agent, or Firm*—Antonelli, Terry & Wands

[57] ABSTRACT

The present invention provides a surface mount Gull-Wing type resin-encapsulating package for encapsulating a semiconductor chip, wherein the cut face (outer tip end) of each outer lead is formed to have a smaller cross-sectional area than that of each outer lead, for improving the extension of solder to the cut face of that lead. Such relatively smaller cross-sectional area of the outer tip end of each outer lead reduces the exposed area of the lead material when disconnecting the leads from the frame in separating the device from the frame.

15 Claims, 11 Drawing Sheets

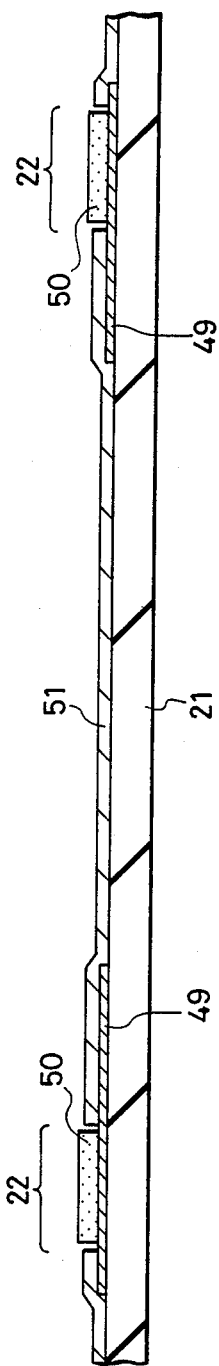
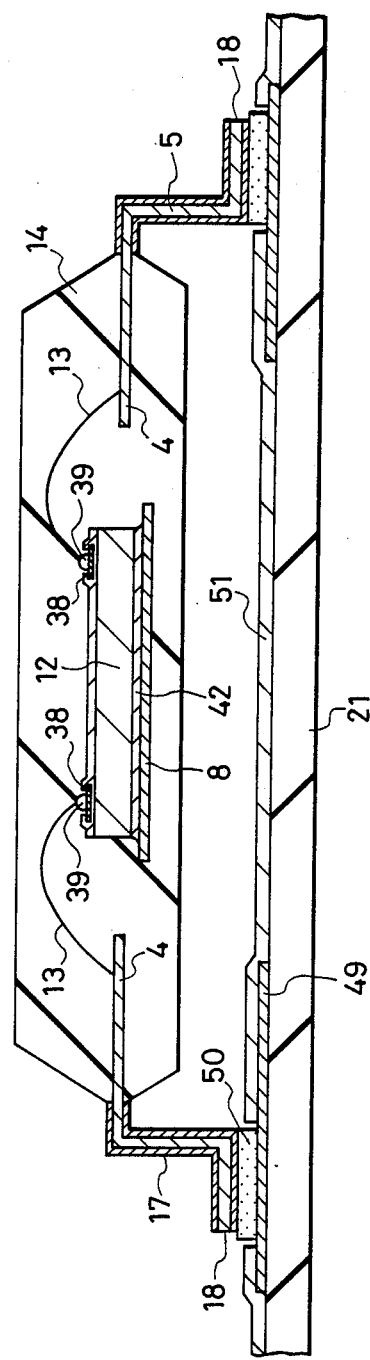
FIG. 18
FIG. 19

SURFACE MOUNT PLASTIC PACKAGE SEMICONDUCTOR INTEGRATED CIRCUIT, MANUFACTURING METHOD THEREOF, AS WELL AS MOUNTING METHOD AND MOUNTED STRUCTURE THEREOF

BACKGROUND OF THE INVENTION

The present invention concerns an electronic device, particularly an electronic device having a surface mount package, and it relates to a useful technique applicable, for example, to a semiconductor integrated circuit device (hereinafter simply referred to as IC) having Gull-Wing outer leads.

As ICs having surface mount packages, those having Gull-Wing outer leads have been known, in which solder plating treatment has been applied to the surface of the Gull-Wing outer leads for improving the solderability upon surface mounting. The plating treatment is applied after forming the package to a lead frame. After applying the plating, the connection portion between the outer leads and the outer frame in the lead frame are cut and the Gull-Wing shape of the outer leads is formed by bending.

The surface mount package is described, for example, in "Micro Devices No. 2", pages 148–154, published by Nikkei McGraw-Hill, on June 11, 1984.

Further, Japanese Patent Laid-Open No. Sho 61-75553 discloses an idea of improving the solder wettability upon mounting in a surface mount plastic package by reducing the width of the lead tips.

SUMMARY OF THE INVENTION

In such a surface mount package IC having Gull-Wing outer leads, it has been found by the present inventors that since solder plating is not applied to the cutting face at the connection portion between the outer lead and the outer frame, there has been a problem that the solderability is worsened at the cut face upon surface mounting, thereby reducing the reliability of the connection and the appearance after mounting.

It may be considered to leave the top end of the outer lead in a free end state without connection to the frame member, at the time of forming the solder plating layer, to thereby form a solder plating layer also on the tip end of the outer lead, but it has been found by the present inventors that there has been problems that the dynamic strength in view of the thermal stresses upon molding and mold pressure is poor.

An object of the present invention is to provide an electronic device capable of improving the solderability of outer leads in the surface mounting, and a method of forming such device.

Another object of the present invention is to provide a semiconductor device useful for surface mounting, and a method of forming such device.

Another object of the present invention is to provide a resin-encapsulated semiconductor integrated circuit capable of facilitating the surface mounting work.

Another object of the present invention is to provide a highly reliable surface mounting method.

Another object of the present invention is to provide a method of manufacturing a resin-encapsulated semiconductor device capable of high density mounting.

Another object of the present invention is to provide a highly reliable surface mount structure for the semiconductor device.

Another object of the present invention is to provide a lead frame for a semiconductor device, which lead frame can be used to provide an electronic device (e.g., a resin-encapsulated integrated circuit) having a highly reliable surface mounting, and a method of forming such lead frame.

The above objects are achieved by the present invention, wherein the cutting face at the connection portion between the outer lead and the outer frame (where a solder plating is not applied) is provided to have a smaller area than the cross-sectional area of the outer lead. By providing the area of the cutting face to be smaller than the cross-sectional area of the outer lead, the soldered portion can be formed over a wide range at the top of the outer lead upon surface mounting, so that it is possible to improve the connection reliability and appearance or performance after surface mounting, while avoiding any problems of integrity and rigidity of the outer leads which could occur if the outer leads were separated from the outer frame prior to performing the solder plating and subsequent steps.

As illustrative of the present invention (and not limitative thereof), recesses can be formed at the boundary between the cutting face and the side faces of the outer leads, so as to reduce the area of the cutting face. By performing the solder plating after forming the recesses, the solder plating layer can also be formed on the surfaces of the recesses, thereby reducing the area not covered by the solder plating layer.

BRIEF DESCRIPTION OF THE DRAWINGS

FIGS. 18–20 are cross-sectional views illustrating steps in the surface mounting process for mounting the resin-encapsulated device on a printed wiring substrate.

DETAILED DESCRIPTION OF THE INVENTION

Example (1) Outline for the Process

Figure 1:
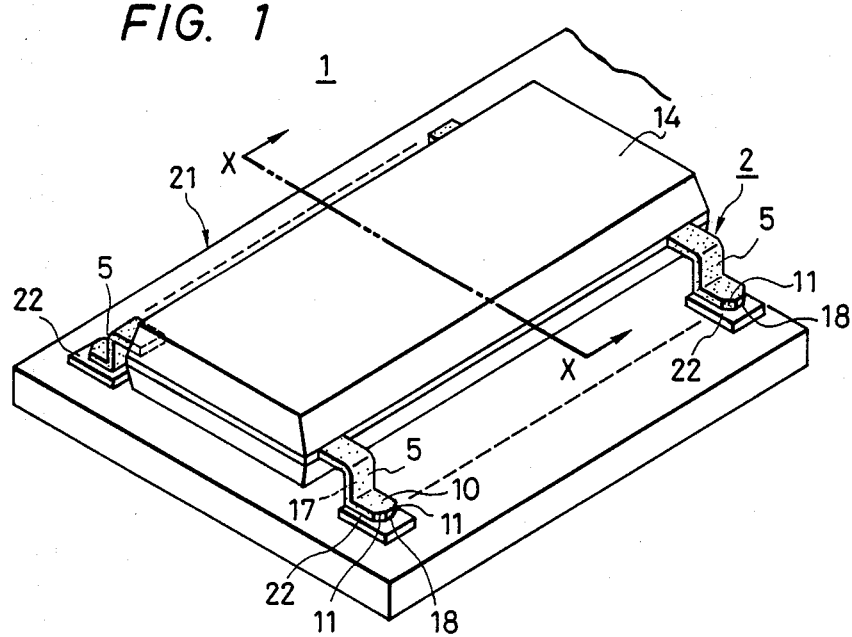
FIG. 1 is a perspective view illustrating a surface mount package IC having Gull-Wing outer leads as one embodiment according to the present invention.
Figure 2:
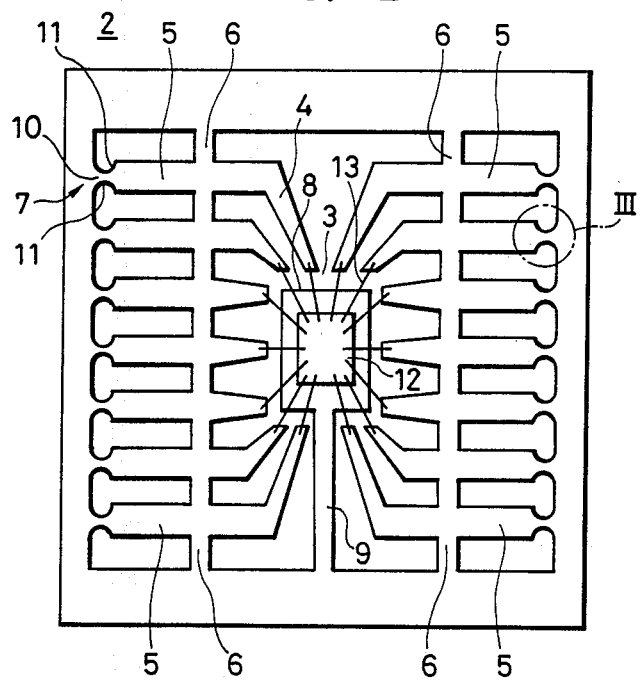
FIG. 2 is a plan view illustrating a schematic pattern for the lead frame used therefor.
Figure 3:
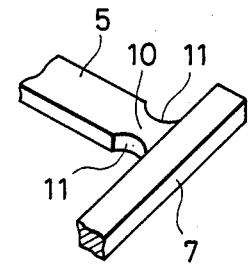
FIG. 3 is an enlarged perspective view illustrating the portion III in FIG. 2.
Figure 4:
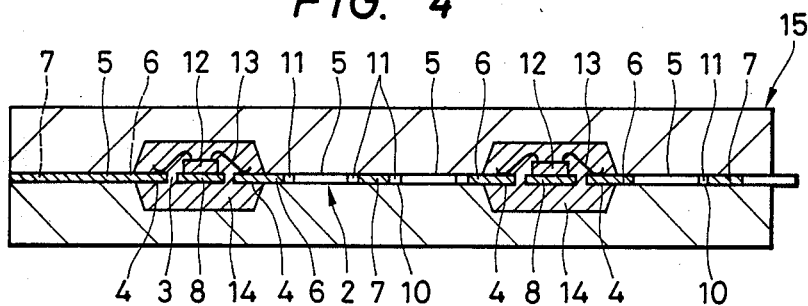
FIGS. 4 and 5 are, respectively, schematic views illustrating a resin-encapsulated semiconductor device of the present invention at specified steps in the course of the production thereof.
Figure 5:
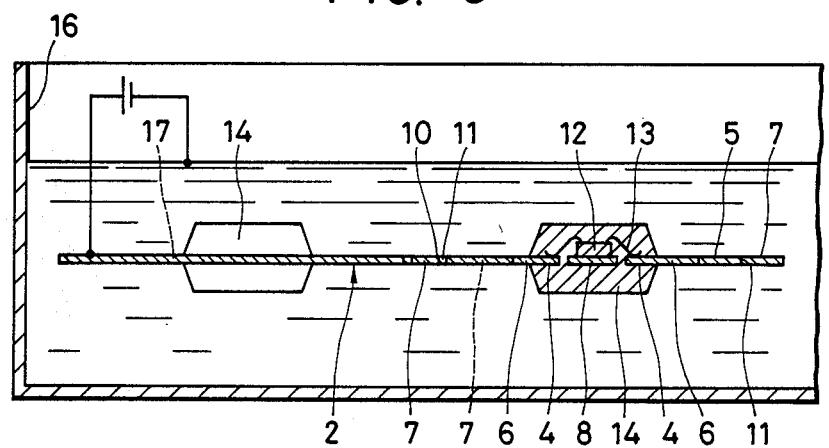
Figure 6:
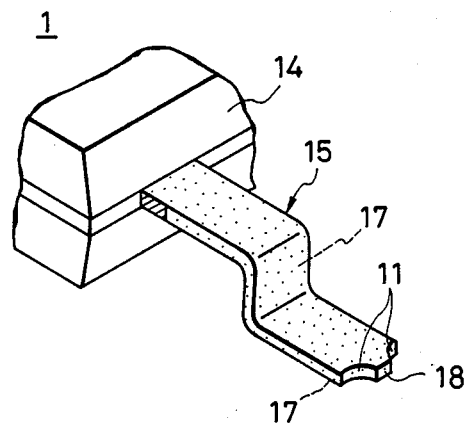
FIG. 6 is a perspective view illustrating the Gull-Wing shape of the outer leads protruding out from the package.
Figure 7:
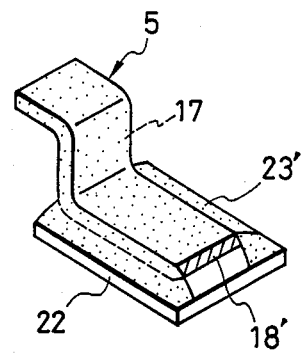
FIGS. 7 and 8 are, respectively, perspective views showing mounting of outer leads on land pads of a wiring substrate, for illustrating the effect of the present invention.
Figure 8:
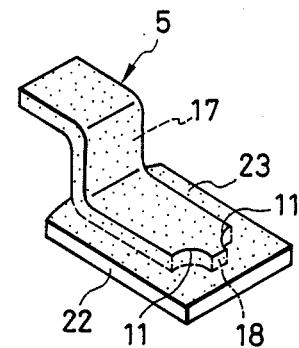

FIG. 1 is a perspective view illustrating a surface mount type package IC having Gull-Wing outer leads as one embodiment according to the present invention; FIG. 2 is a plan view illustrating a lead frame used therefor; FIG. 3 is an enlarged perspective view for a portion illustrating the portion III in FIG. 2; FIGS. 4 and 5 are, respectively, schematic views illustrating the package IC in the course of the production thereof; FIG. 6 is a perspective view illustrating the Gull-Wing shape of the outer leads protruding from the package IC; and FIGS. 7 and 8 are, respectively, perspective views showing mounting of outer leads on lead pads of a wiring substrate, for illustrating the effect of the present invention.

In this embodiment, IC 1 has a lead frame 2 and the lead frame 2, before the formation of the outer leads, is constituted as shown in FIG. 2. That is, the lead frame 2 comprises a plurality of inner leads 4 disposed substantially radially so as to leave a generally square space 3 at the center thereof, a plurality of outer leads 5 integrally connected to each of the inner leads 4 and arranged in two rows, dams 6 bridging adjacent outer leads 5, 5, an outer frame 7 formed into substantially rectangular frame shape and connected at the opposing sides thereof with the group of outer leads 5 respectively, a tab 8 disposed in the space 3 and formed as a substantially square flat plate somewhat smaller than the space and a tab suspending lead 9 extending from the outer frame 7 for suspending the tab 8.

At the connection portion between each of the outer leads 5 and the outer frame 7, a pair of recesses 11 are disposed at both outer side ends of each outer lead 5, respectively, and each recess has a substantially semi-circular shape. The lead frame is formed, for example, by a punching press. Each recess 11 can be formed simultaneously upon punching the tab 8 by forming a blade of a pressing die for punching the outer leads 5 and the outer frame 7 to a desired configuration corresponding to the recess 11. Further, each recess 11 can also be formed by applying etching to the connection portion 10 between the outer lead 5 and the outer frame 7.

A pellet 12 having an integrated circuit fabricated therein is bonded on the tab 8 by adequate means, as known conventionally, and wires 13 are bonded between electrode pads (not illustrated) of the pellet 12 and a respective one of the inner leads 4. The integrated circuit in the pellet 12 is electrically led out externally by way of the electrode pad, wires 13, inner leads 4 and outer leads 5.

Then, a package 14 is integrally molded substantially in a rectangular flat plate shape to the lead frame 2 on which the thus constituted pellet 12 is mounted, as shown in FIG. 4, by using a resin as the molding material by a transfer molding device 15. A portion of the lead frame 2, and the pellet 12, the wires 13 and the tab 8 are encapsulated not in an airtight manner by the package 14. That is, the group of the outer leads 5 other than the tab 8, etc., protrude from two sides of the package 14. Since the outer leads 5 are integrally connected with the outer frame 7 by means of the connection portion 10, they are neither bent nor deformed during the package molding operation.

Then, a preliminary solder layer 17 is formed on the lead frame 2 molded with the package 14, as shown in FIG. 5, over the entire surface of the portions protruded from the package 14, by using an electrolytic plating device 16. Also in this case, since the outer lead is maintained integral with the outer frame 7, they are neither bent nor deformed.

Then, the connection portions 10 between the outer leads 5 and the outer frame 7, and the dams 6 of the lead frame 2, are respectively cut, and the group of the outer leads 5 are bent downwardly at the outside of the package 14 and are then bent horizontally outwardly, thereby being formed into a so-called Gull-Wing shape as shown in FIG. 6. Since the material of the lead frame is exposed as a cut face (cut end) 18 at the connection portion 10 between the outer leads 5 and the outer frame 7, the surface of the cut face 18 is not deposited with the solder layer 17. However, since the recesses 11 are formed to the connection portion 10 and the solder layer 15 is deposited on the surface of the recess 11, the area of the surface at the cut face 18 not deposited with the solder layer 17 is sufficiently decreased as compared with the cross-sectional area of the outer lead 5.

The method of using and the function of the IC 1 manufactured as described above will be explained below.

As shown in FIG. 1, the IC 1 is mounted on a wiring substrate 21 such that each of the outer leads 5 is aligned with each of the land pads 22 wired and formed to the substrate 21; and, as shown in FIG. 8, soldering is applied between the land pad 22 and the outer lead 5. As is clear from FIG. 1, particularly in view of the tapered free end of outer lead 5 the outer lead 5 does not cover entirely the land pads 22. By the soldered portion 23, the IC 1 is surface mounted to the wiring substrate 21 while being connected electrically and mechanically thereto.

By the way, as shown in FIG. 7, if the area of the cut face 18' at the tip end of the outer lead, as disconnected from the outer frame, is equal to the cross sectional area of the outer lead, since the cut face 18' is not deposited with the solder plating layer 17 pick-up of the solder material from the land pad 22 is poor and the cut face 18' may partially lack in the soldered portion 23'.

In a case where the soldered portion is not properly formed over the entire top of the outer lead as described above, since the soldered portion 23' is partially depleted after the mounting it not only worsens the appearance but also reduces the electrical and mechanical connecting property.

However, in this embodiment, since the area of the cut face 18 after being separated from the outer frame 7 is made smaller than the cross sectional area of the outer lead 5, the soldered portion 23 is uniformly formed over the entire portion as shown in FIG. 8 although the soldered layer 17 is not deposited. That is, since the plating layer 17 is formed on the surface of the recesses 11 formed at both sides of the cut face 18, respectively, the soldering material is effectively picked up to the surface and grown by surface tension, thereby bridging the narrow cut face 18 from both sides thereof.

Figure 21:
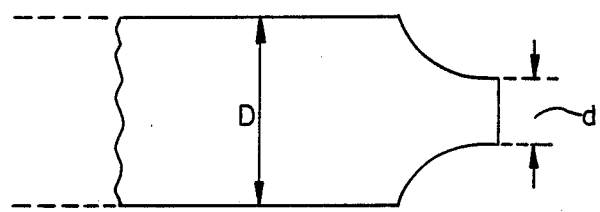
FIG. 21 is a view of the end of an outer lead, for illustrating the size difference between the cutting face and outer lead.

Reference is directed to FIG. 21, for an illustration of the difference in size between the cross-sectional area of cut face 18 and the cross-sectional area of the outer leads. In the structure shown in FIG. 21, the thickness of the outer lead and thickness of the cut face (dimension perpendicular to the sheet) is the same. With D representing the width of the outer leads and d representing the width of the cut face, it is preferred that the ratio of width of the cut face to width of the outer lead (d/D) is $1/5 \leq d/D \frac{2}{3}$. Of course, this range for the ratio is illustrative, and not to be limiting.

According to the embodiment described above the following effects can be obtained:

(1) Since the area of the cut face after being separated from the outer frame of the outer lead is smaller than the cross-sectional area of the outer lead, the soldered portion can be formed over a broad range to the top of the outer lead with respect to the land pad, and it is possible to improve the connection reliability and the appearance and function after surface mounting.

(2) Since the outer lead is connected with the outer frame by way of the connection portion upon molding the package and applying solder plating, the integrity and the rigidity can be maintained to avoid the reduction in the productivity or working efficiency.

(3) Since the recesses are cut in the lead frame, the area for the cut face can be made smaller than the cross-sectional area of the outer lead, and, accordingly, the solderability upon surface mounting can be improved without reducing the productivity or the working efficiency.

Although the invention made by the present inventors has specifically been explained referring to a preferred embodiment, the invention is no way limited only to the foregoing embodiment but can be varied within a scope not departing from the gist thereof.

Figure 9:
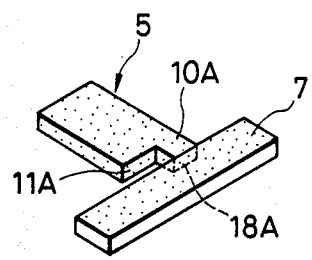
FIGS. 9, 10 and 11 are, respectively, enlarged perspective views of the ends of the outer leads, connected to the outer frame, illustrating modified embodiments of the present invention.
Figure 10:
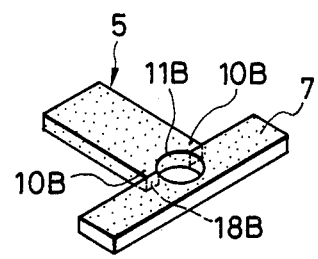
Figure 11:
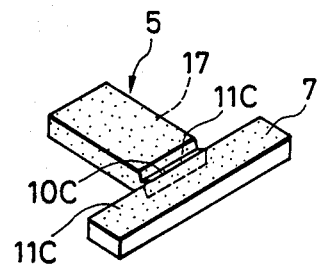

For instance, the recess is not restricted only to such a constitution that semi-circular recesses are disposed on both side ends of the outer lead but it may be constituted also as shown in FIGS. 9, 10 and 11.

In FIG. 9, a slit-like recess 11A is cut between the outer lead 5 and the outer frame 7 so as to leave a connection portion 10A on one side of the outer lead 5.

In FIG. 10, a recess 11B in the form of a circular perforation is cut between the outer lead 5 and the outer frame 7 so as to leave connection portions 10B on both sides of the outer lead 5.

In FIG. 11, a recess is cut between the outer lead 5 and the outer frame 7 so as to leave a connection portion 10C (of reduced thickness) at the central portion along the thickness of the outer lead 5.

In the foregoing, explanation has been made mainly to a case where the invention made by the present inventors is applied to a surface mount type package IC having Gull-Wing type leads, which is the background art of the invention, but the invention is not restricted only thereto, and is also applicable to other electronic devices, in general, of surface mount type ICs having J-bent type leads or beam type leads, etc. The advantageous effect obtained by the embodiment as described above will be explained briefly below.

By forming the area of the cut face of the outer lead, after being separated from the outer frame, to be smaller than the cross-sectional area of the outer lead, since the soldered portion can be formed over a wide range at the top of the outer lead relative to the land pad upon surface mounting it is possible to improve the connection reliability and appearance or performance after the surface mounting.

Referring to the outline of typical embodiments of the invention disclosed in the present application, that is, an electronic device having a surface mount type package, each of the lead wires is constituted such that the area of the cut face of the outer lead at the connection portion, after separation from the outer frame, is made smaller than the cross-sectional area of the outer lead.

According to the means as described above, since the surface area of the cut face formed between the outer lead and the outer frame is made smaller than the cross-sectional area of the outer lead, a cut face not applied with the soldering plating, if any, causes no substantial effect upon surface mounting and the soldering material can effectively be deposited over the outer lead. Accordingly, reduction in reliability and appearance regarding the solder connection after mounting can be suppressed.

On the other hand, since the outer lead is maintained connected with the outer frame in the lead frame upon molding of the package or applying solder plating treatment, adequate rigidity, etc., and integrity can be provided for each of the leads, thereby ensuring the intended performance in the molding or plating treatment for the package, as well as working efficiency.

(2) Details for the Lead Frame:

Details of the previous embodiment are explained with respect to a lead frame suitable for mass production. Such a lead frame of the present discussion corresponds to the lead frame shown in FIG. 2.

Figure 12:
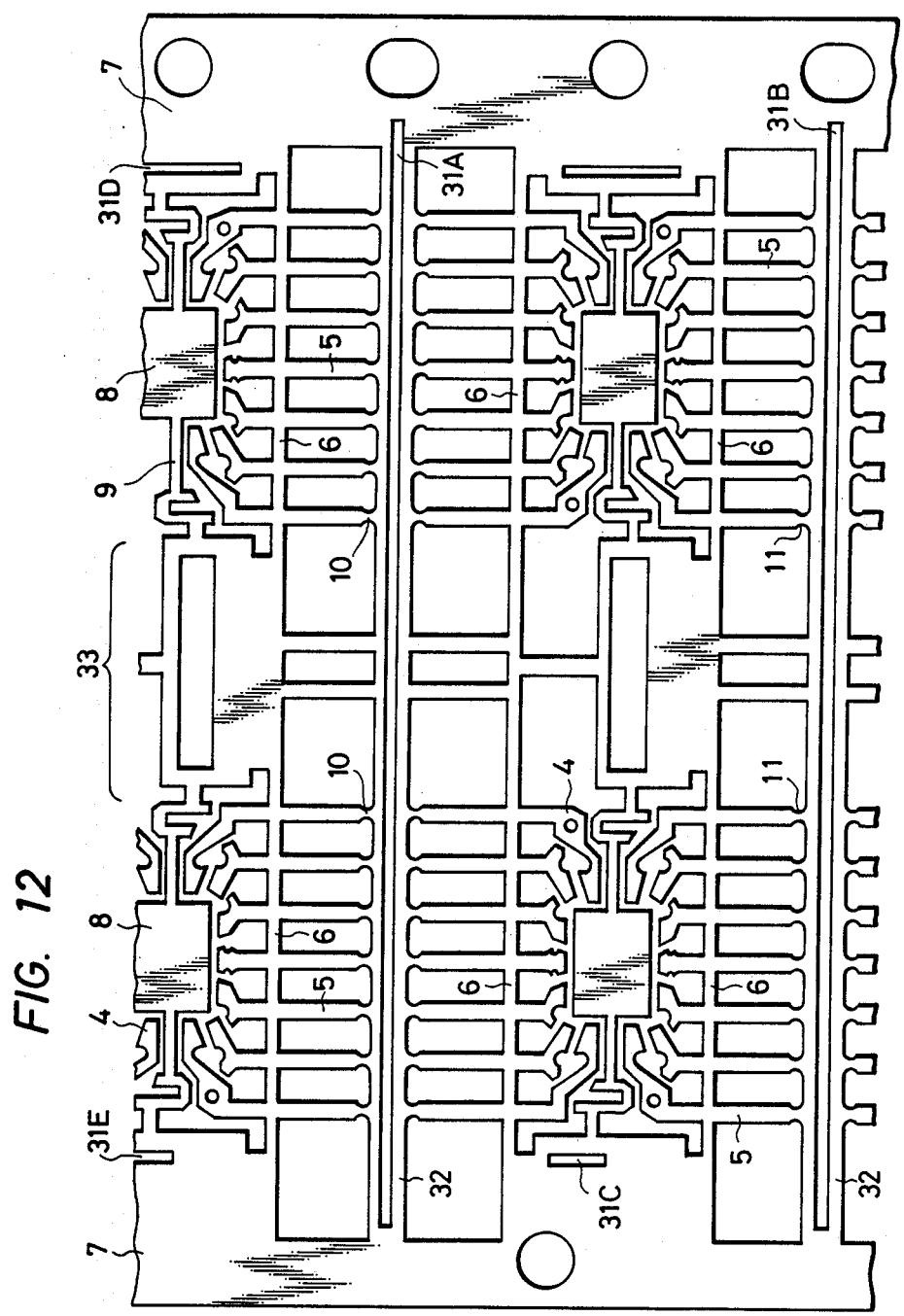
FIG. 12 is a plan view showing the details for a specific lead frame pattern in the present embodiment.

FIG. 12 is a plan view showing the state of the lead frame. Although the lead frame illustrated shows a region for about 4 devices, they are actually connected longitudinally over the length about ten times the shown length. The lead frame was formed by press punching or etching from a thin sheet of 0.15-0.2 mm thickness made of a copper-based alloy comprising from 1.7 to 2.3% by weight of Sn, from 0.1 to 0.4% by weight of Ni, and trace amount of Fe, P, Zn and Pr. In FIG. 12, there are shown inner leads 4, outer leads 5, dam 6 for preventing the leak of resin upon transfer molding, an outer frame 7 for supporting these leads, etc., a tab 8 for securing a semiconductor pellet thereon (pellet holding portion or chip support member) tab suspending leads 9 for supporting the tab, connection portions 10 corresponding to the free ends of the outer leads (restriction or narrowed portion), recesses 11, slit-like openings 31A-E for absorbing stresses upon molding, boundary frame 32 for dividing a plurality of device regions from each other and an inner frame region 33.

Figure 13:
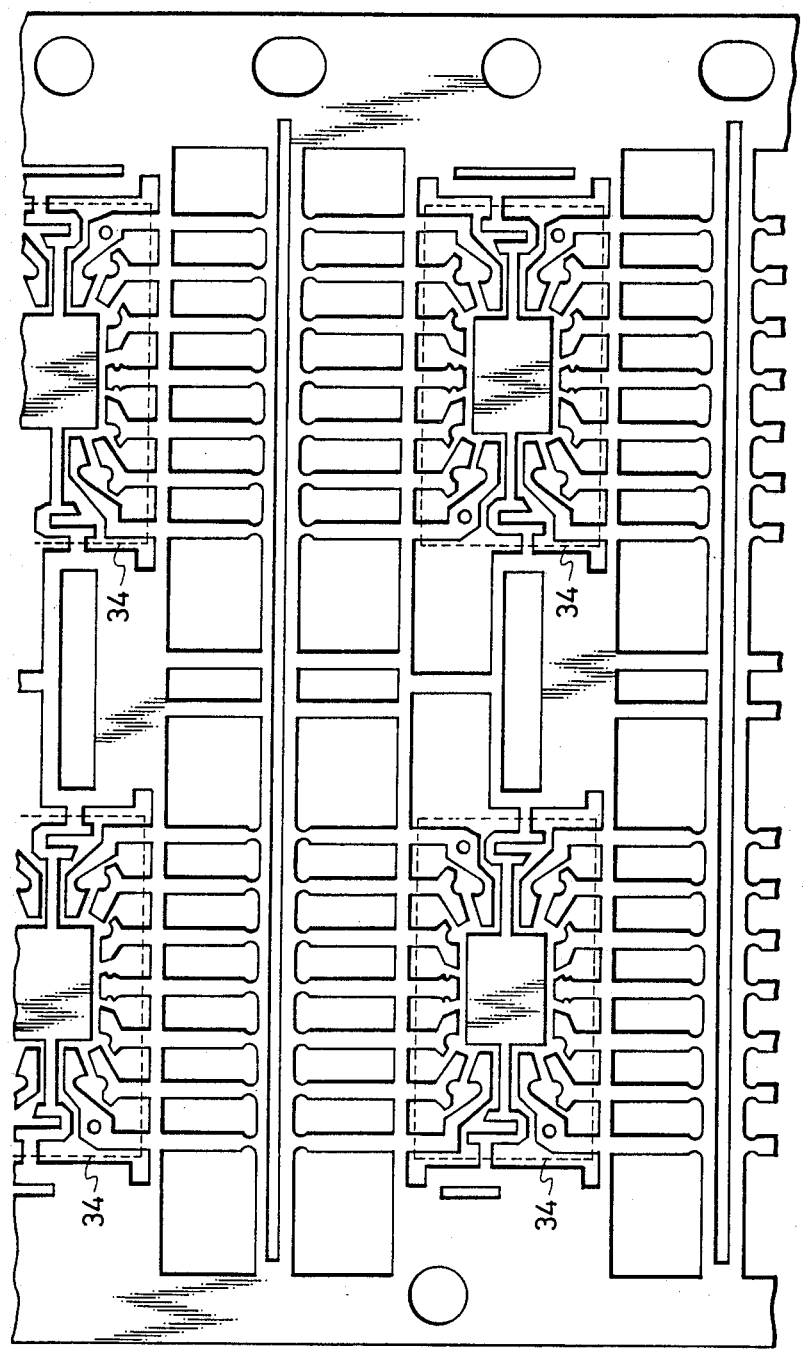
FIG. 13 is a plan view illustrating a resin-encapsulated portion of the lead frame.

FIG. 13 shows the state in which the region 34 surrounded with a broken line in the plane region of the lead frame is transfer molded with an epoxy resin having a heat curing property with the heat expansion coefficient of about $2.1-2.5 \times 10^{-5}/°C.$, as shown in FIG. 4.

Figure 14:
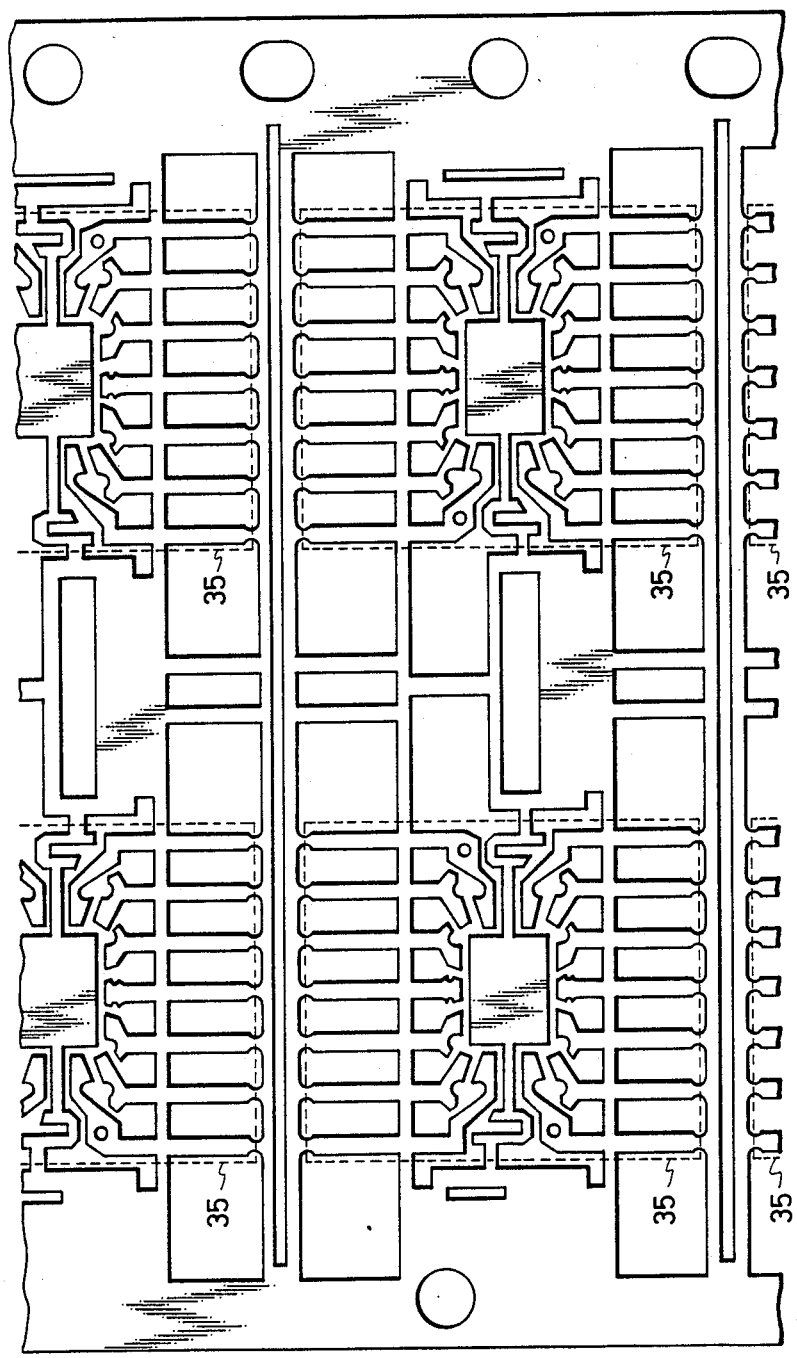
FIG. 14 is a plan view illustrating a cutting location between the frame member and the resin encapsulated body in the lead frame.

FIG. 14 shows the case where a resin encapsulated body is formed, then formed with a soldering layer of about 9 μm thickness substantially over the entire surface of the exposed lead frame by means of electrolytic plating, and then the device is separated from the frame member at the cutting face depicted by the broken line 35.

(3) Details of the Structure of a Resin-Encapsulated IC:

The semiconductor device package to which the present invention is mainly applied is generally referred to as a Gull-Wing type and grouped into SOP (small outline package), SSOP (shrink outline package), QFP (quad flat package), etc.

Figure 15:
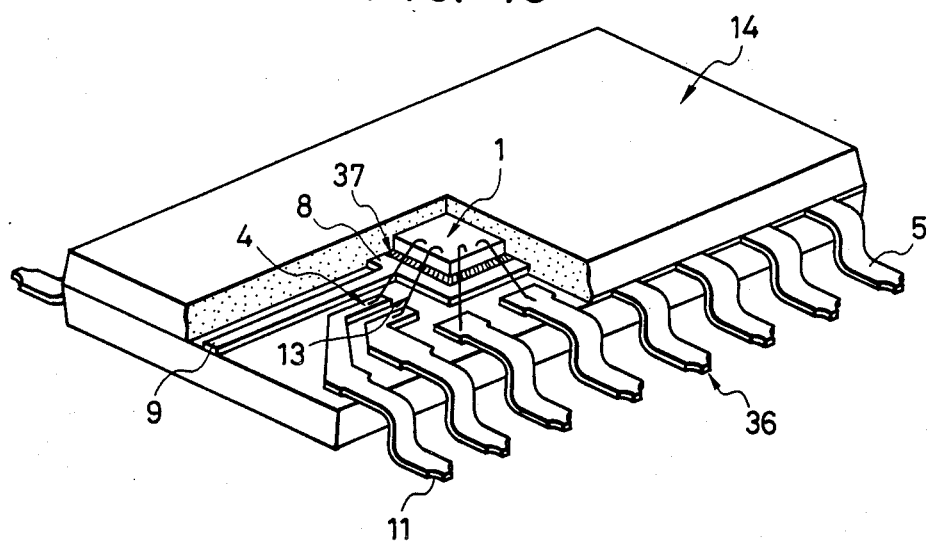
FIG. 15 is a perspective view, partially in cross-section, for illustrating the inner structure of a surface mount resin-encapsulated device according to the present invention.

FIG. 15 shows a detailed structure for an SOP. There are shown an Si chip (semiconductor integrated circuit or semiconductor device pellet) 1, outer leads 5 mainly composed of Cu matrix material and applied with solder plating except for the top front 36 at the surface, inner leads 4, a tab 8, tab suspending leads 9, recesses 11 formed on the side of the free ends of the outer leads and applied with solder plating, bonding wires 13 of 30 μm diameter made of non-oxygen copper (by non-oxygen copper, we mean a copper that is purified so as to consist essentially of more than 99.999% Cu by weight, by excluding impurities included in Cu such as oxygen or some oxide thereof) at a purity of 99.999% or higher, which connects the Al pad on the chip 1 and the inner lead 4, a resin encapsulating member 14 (the surface of which is roughened into a satine-like state for preventing the generation of static charges and indicated with a device number, etc., on the main surface thereof by means of laser marking, etc.), and electroconductive paste or Ag paste layer 37 for securing the pellet 1 on the tab 8.

As the pellet usable herein, there may be considered TTL or CMOS logic, etc., with 2 mm square and 400 μm thickness. In this case, the number of pins is from 14 to 16, and an Al pad is sized as 120 μm square and disposed at 180 μm pitch.

Figure 16:
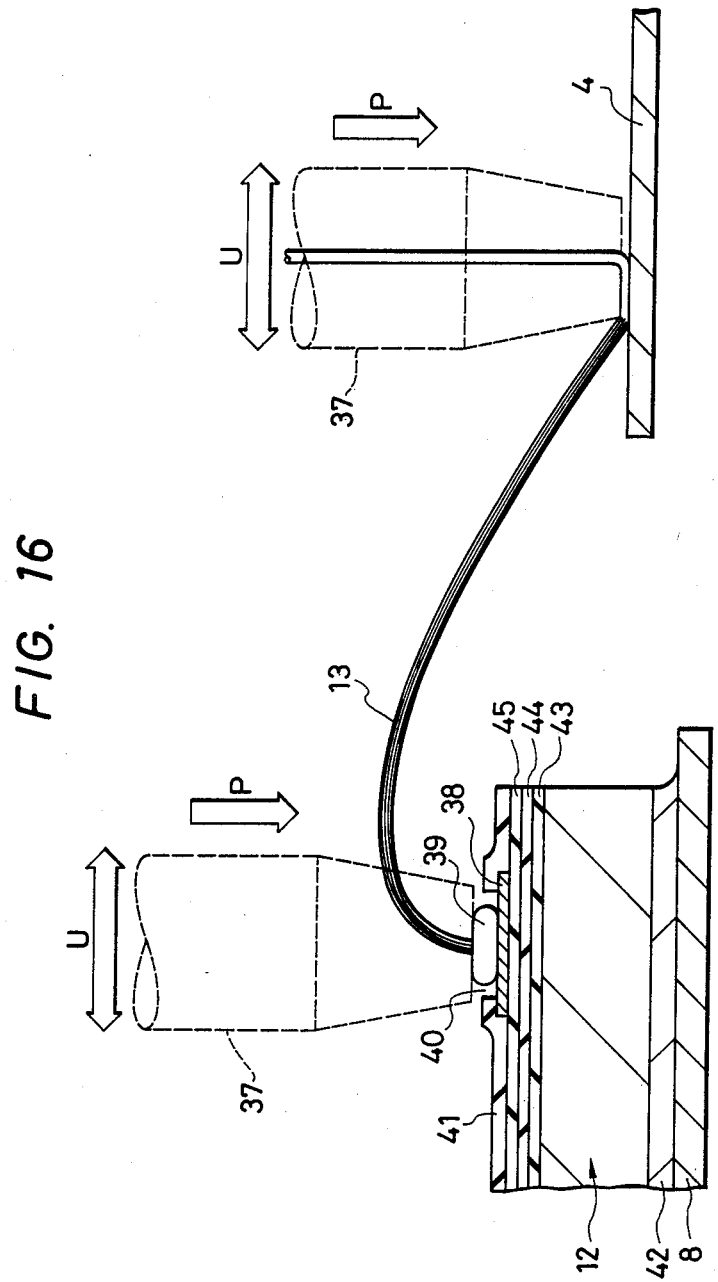
FIG. 16 is a schematic cross-sectional view illustrating a wire bonding process in producing the surface mount device according to the present invention.

(4) Details for the Wire Bonding Process:

FIG. 16 illustrates a step for wire bonding shown in FIG. 15. In the figure are shown an inner lead 4 made of copper alloy, a tab 8, an Si single crystal pellet 12, an Al bonding pad 38 on the pellet 12, a Cu wire 13 ball-wedge bonded (as known in the art, wherein one end of the wire is ball-bonded to a bonding pad, and the other end of the wire is wedge-bonded to a lead) by means of a capillary 37 to the Al bonding pad 38 and a corresponding inner lead 4, a ball 39 formed at the end of the wire 13 by means of electric discharge or $H_2$ torch, an opening 40 to the pad, a final passivation layer 41 for the chip which is made of phosphosilicate glass or silicon nitride, an Ag paste layer 42 for tie-bonding the pellet 12 to the copper surface of the tab 8, a field $SiO_2$ film 43 such as made of a LOCOS oxide layer, and inter-layer insulation films 44 and 45 made of a material such as PSG (phosphosilicate glass), BSG (boron silicate glass), BPSG (boron phosphosilicate glass), etc. P represents the direction of applying a load to the capillary and U represents the direction of supersonic vibrations applied by way of the capillary during bonding. The tab 8 is secured at a position lower than the inner end of lead 4, which can prevent short circuit at the tab end caused by the sag of the wire 13. Such lowering of tab 8 (and the configuration achieved thereby) are known in the art; to achieve the lowering of the tab, the tab is pressed down with a pressing member so as to suspend the tab at the lowered position by a pair of deformed tab suspending leads. Further, the chip and the leads are heated to about 350° C. from below by a heat block upon bonding. This enables a satisfactory connection to be attained between the pad 38 formed of the Al layer and the wire 13, as well as between the copper surface of the inner lead 4 and the wire.

(5) Details for the Mounting Process:

FIGS. 17–20 are cross sectional views for the reflow device, substrate and IC for explaining the process.

Figure 17:
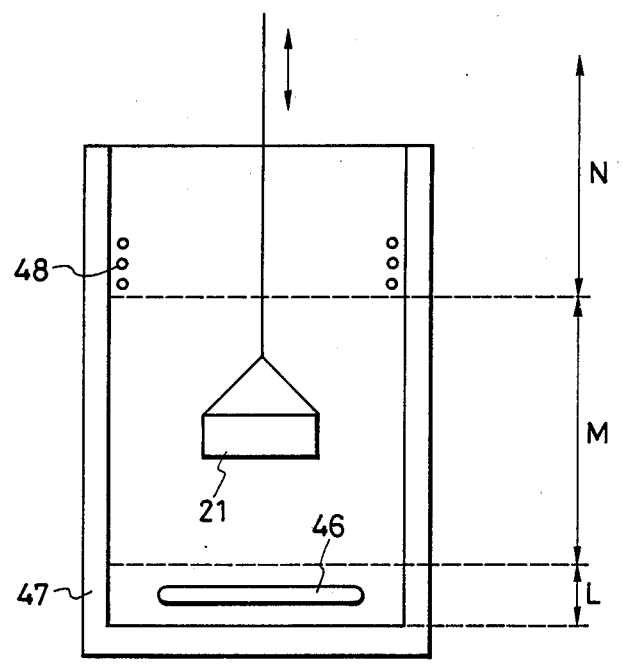
FIG. 17 is a cross-sectional view illustrating the outline of a reflow device used in the vapor phase reflow step.

FIG. 17 shows a device for vapor phase soldering. In the figure are shown a printed wiring substrate 21 having an IC, etc., to be soldered mounted thereon; a heater 46; a chemical resistant vessel 47; a condensation coil 48; and a primary liquid L comprising perfluorotriamyl amine (($C_5F_{11}$)$_3$N, manufactured under the commercial name of "Flourinert EC-70", from 3M Co., boiling point 215° C., density 1940 kg/m$^3$, molecular weight of 820 and vapor pressure at 25° C. of below 13 Pa). Also shown in FIG. 17 are "M" and "N"; M represents the vapor, that is, vapor of the primary liquid, and N represents a secondary vapor for preventing loss due to the flowing of the vapor of the primary liquid, the secondary vapor comprising, e.g., trichlorotrifluoro ethane (Freon TF, boiling point 48° C.).

FIG. 18 illustrates a printed wiring substrate before mounting the IC package. In the figure are shown an insulation plate 21 for a wiring substrate, made of a material such as glass epoxy, a soldering paste layer 50 comprising a mixture of solder and solder flux, a copper wiring layer 49, a solder-resist layer 51 of 10 μm thickness made of acrylic resin and cured under UV irradiation, and a land pad region 22.

FIG. 19 illustrates an IC device mounted on a soldering paste pattern, but before performing the reflow process. In the figure are shown copper inner leads 4, copper matrix material portions 5 for the outer leads, a copper tab 8, an Si chip 12, Cu bonding wires 13, a resin package 14, a solder plating layer 17, cut faces 18 at the front of the free ends of the outer leads, an Al pad 38 on the chip 12, Cu balls 39 and an Al paste layer 42.

As shown in FIG. 6 or FIG. 15, the resin encapsulated IC separated into individual devices is applied with surface mounting as described below.

At first, as shown in FIG. 18, a wiring substrate covered with solder resist other than at the land pad 22 is prepared, on which a soldering pattern is deposited by way of screen printing.

Then, as shown in FIG. 19, the IC device is mounted such that the vicinity of the top of the outer lead is extended at a position below the lower main face of the package 14 and outwardly about in parallel with the main surface and in contact with the soldering paste surface. Then, it is placed in a reflow vessel as shown in FIG. 17. When the substrate is put into the primary vapors in the reflow furnace, condensation of saturated vapors occurs at the lead surface to uniformly heat the lead surface by the latent heat, and, accordingly, solder in the soldering paste is melted to wet the tip end and the vicinity of the lead substantially completely.

Figure 20:
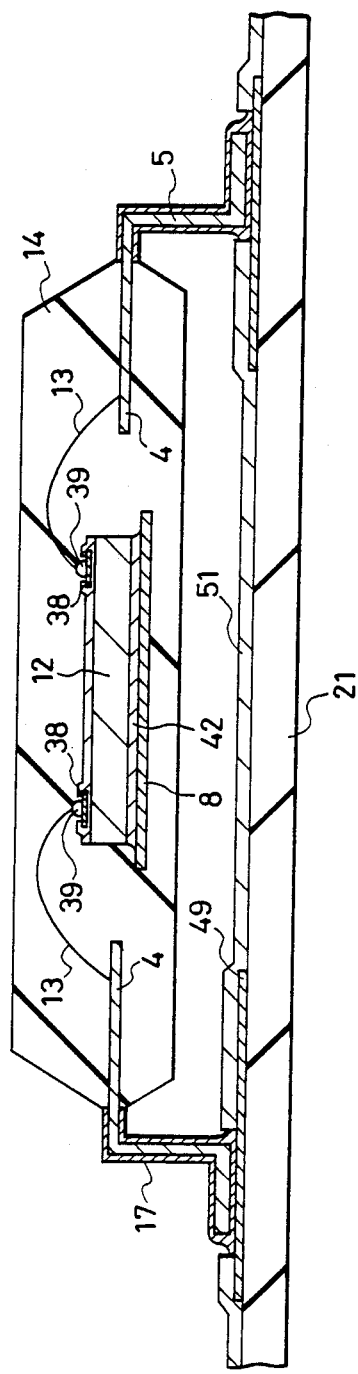

Then, when the substrate is put for a while in the secondary vapors, all of the condensed liquids are evaporated so that the lead is in a dried state, and the solder is solidified at the time of temperature lowering, and soldering is completed as shown in FIG. 20.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A process for manufacturing a surface mount resin-encapsulated semiconductor device using a lead frame formed from a metal film into a predetermined shape, wherein the process comprises the steps of:
   (a) forming a plurality of resin encapsulating bodies, each having paired main upper and lower surfaces, each resin encapsulating body encapsulating a corresponding semiconductor device, the plurality of resin encapsulating bodies being formed at a plurality of predetermined locations of a lead frame comprising a frame member and leads, each of the leads having a lead part, including a free end, protruding out from a resin encapsulating body, the frame member and leads being connected via connecting portions extending between the frame member and leads, each of the leads and the connecting portions having a cross-sectional area, the cross-sectional area of the connecting portions being smaller than the cross-sectional area of the leads;
   (b) forming a soldering layer on the surface of said lead frame subsequent to forming the plurality of resin encapsulating bodies;
   (c) disconnecting each lead and the frame member at the connecting portions between said frame member and each of the leads, subsequent to the step of forming the soldering layer; and
   (d) shaping the free end, and the vicinity thereof, of each of the leads into such a shape that the free end and vicinity thereof is situated at a position below the main lower surface of the resin encapsulating body from which the respective lead protrudes, substantially in parallel with the main surface of the resin encapsulating body and extending away from said encapsulating body.

2. A process for manufacturing the semiconductor device as defined in claim 1, wherein the resin encapsulating bodies are formed by a transfer molding process.

3. A process for manufacturing the semiconductor device as defined in claim 1, wherein the step of forming a soldering layer forms the soldering layer on exposed surfaces of the parts of the leads protruding out from the respective resin encapsulating body, and on exposed surfaces of the connecting portions.

4. A method of surface mounting a resin-encapsulated semiconductor device, comprising the steps of:
   (a) forming a solder-containing composition layer of a predetermined pattern over land pads of a printed wiring substrate having a plurality of such land pads at least on one main surface thereof;
   (b) placing a plurality of resin-encapsulated semiconductor devices onto said composition layer, the resin-encapsulated semiconductor devices having leads protruding out from the resin encapsulation and extending to free ends thereof, the free ends terminating with a front face, the plurality of resin-encapsulated semiconductor devices being placed such that the free ends of the leads are substantially in parallel with the main surface on which the solder-containing composition layer has been formed; in which
   each of the free ends of the leads is tapered toward the front face and is coated with a soldering layer except for the front face, the front face being exposed;
   (c) heating the leads and the composition layer substantially simultaneously, thereby melting the solder; and
   (d) cooling the solder, thereby completing the soldering.

5. A method of surface mounting as defined in claim 4, wherein the melting of the solder in the step (c) is carried out by a vapor phase reflow method.

6. A method of surface mounting as defined in claim 5, wherein the composition layer comprises a solder paste.

7. A method of surface mounting as defined in claim 6, wherein the main surface on which the solder-containing composition has been formed, except for the land pads, is coated with solder-resist.

8. A process for manufacturing the semiconductor device as defined in claim 1, wherein the cross-sectional area of the connecting portions is smaller than the cross-sectional area of the leads at a location of each of the connecting portions where each lead and the frame member are disconnected, the disconnecting step disconnecting each lead and the frame member at said location.

9. A method of surface mounting as defined in claim 4, wherein a remaining portion of each of the leads, other than the free ends, have a cross-sectional area, the cross-sectional area of the remaining portion of each of the leads being greater than the area of the front face of each free end.

10. A process for manufacturing the semiconductor device as defined in claim 1, wherein the step (c) is conducted prior to the step (d).

11. A process for manufacturing the semiconductor device as defined in claim 1, wherein the ratio of cross-sectional area of the connecting portions to that of the lead is from 1/5 to ⅔.

12. A process for manufacturing the semiconductor device as defined in claim 1, wherein the connecting portions are provided with a smaller cross-sectional area than the cross-sectional area of the outer leads by providing recesses at at least one side of the connecting portions so as to reduce the cross-sectional area of the connecting portions as compared to the cross-sectional area of the connecting portions without the recesses.

13. A process for manufacturing the semiconductor device as defined in claim 1, wherein the connecting portions are provided with a smaller cross-sectional area than that of the leads by providing the connecting portions with a reduced thickness as compared to the thickness of the leads.

14. A process for manufacturing the semiconductor device as defined in claim 1, wherein the connecting portions are provided with a smaller cross-sectional area than that of the outer leads by providing recesses at the connecting portions so as to reduce the cross-sectional area of the connecting portions as compared to the cross-sectional area of the connecting portions without the recesses.

15. A method of surface mounting as defined in claim 4, wherein, upon melting the solder, the solder flows so as to cover the exposed front face of the free ends of the leads.

* * * * *